US007408212B1

(12) United States Patent
Luan et al.

(10) Patent No.: US 7,408,212 B1
(45) Date of Patent: Aug. 5, 2008

(54) STACKABLE RESISTIVE CROSS-POINT MEMORY WITH SCHOTTKY DIODE ISOLATION

(75) Inventors: Harry S. Luan, Saratoga, CA (US); Jein-Chen Young, Milpitas, CA (US); Arthur Wang, San Jose, CA (US); Kai-Cheng Chou, San Jose, CA (US); Kenlin Huang, Fremont, CA (US)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 10/777,560

(22) Filed: Feb. 11, 2004

Related U.S. Application Data

(60) Provisional application No. 60/488,565, filed on Jul. 18, 2003.

(51) Int. Cl.
*H01L 29/76* (2006.01)
(52) U.S. Cl. .................. 257/295; 257/295; 257/296; 257/E29.338
(58) Field of Classification Search .......... 257/E29.338, 257/295, 296, 281
See application file for complete search history.

(56) References Cited

U.S. PATENT DOCUMENTS

| | | | | |
|---|---|---|---|---|
| 4,203,123 A | * | 5/1980 | Shanks | 257/2 |
| 5,640,343 A | * | 6/1997 | Gallagher et al. | 365/171 |
| 5,978,262 A | * | 11/1999 | Marquot et al. | 365/185.01 |
| 6,185,122 B1 | * | 2/2001 | Johnson et al. | 365/103 |
| 6,204,139 B1 | | 3/2001 | Liu et al. | 438/385 |
| 6,531,371 B2 | | 3/2003 | Hsu et al. | 438/385 |
| 6,625,055 B1 | * | 9/2003 | Smith et al. | 365/148 |
| 6,750,540 B2 | * | 6/2004 | Kim | 257/741 |
| 6,870,755 B2 | * | 3/2005 | Rinerson et al. | 365/148 |
| 6,906,939 B2 | * | 6/2005 | Rinerson et al. | 365/63 |

OTHER PUBLICATIONS

Zhuang et al., "Novell Colossal Magnetoresistive Thin Film Non-volatile Resistance Random Access Memory (RRAM)," IEEE 2002.
Liu et al., "A New Concept for Non-Volatile Memory: The Electric Pulse Induced Resistive Change Effect in Colossal Magnetoresistive Thin Films."
Liu et al., "Electric-pulse-induced reversible resistance change effect in magnetoresistive films," American Institute of Physics, 2000, p. 2749-2751.

* cited by examiner

*Primary Examiner*—Andy Huynh
*Assistant Examiner*—Thinh T Nguyen
(74) *Attorney, Agent, or Firm*—Dinh & Associates

(57) ABSTRACT

An electrically programmable, non-volatile resistive memory includes an array of memory cells, a plurality of bit lines, and a plurality of word lines. Each memory cell comprises a resistive element and a Schottky diode coupled in series and having first and second terminals. Each bit line couples to the first terminal of all memory cells in a respective column of the array. Each word line couples to the second terminal of all memory cells in a respective row of the array. The resistive element for each memory cell may be formed with a film of a perovskite material (e.g., $Pr_{0.7}Ca_{0.3}MnO_3$). The Schottky diode for each memory cell may be formed by a thin film of amorphous silicon. The films for the resistive element and Schottky diode for each memory cell may be stacked in a compact island at the cross point between a bit line and a word line.

14 Claims, 9 Drawing Sheets

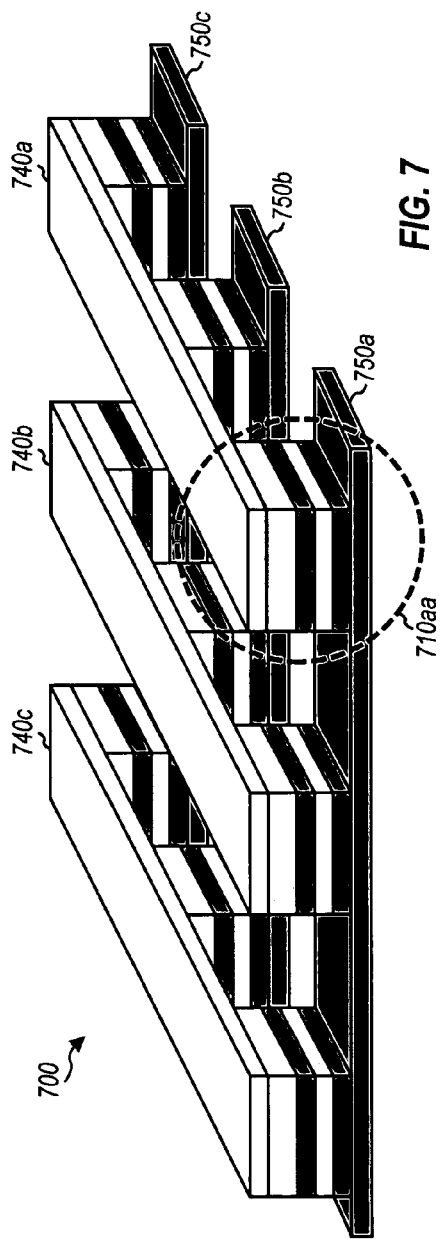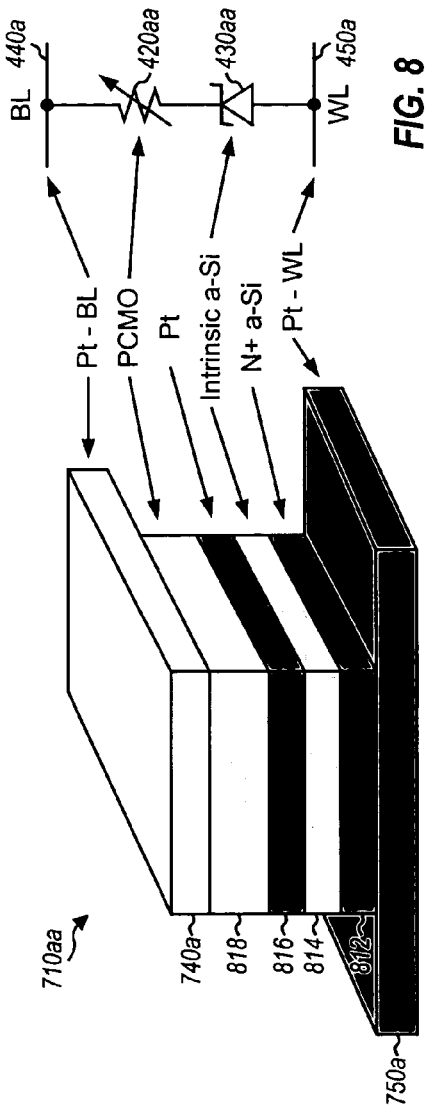

STACKABLE RESISTIVE CROSS-POINT MEMORY WITH SCHOTTKY DIODE ISOLATION

CLAIM OF PRIORITY UNDER 35 U.S.C. §119

This application claims the benefit of provisional U.S. Application Ser. No. 60/488,565, entitled "A Stackable Resistive Cross-Point Memory with a-Si Schottky Diode Isolation," filed Jul. 18, 2003, which is incorporated herein by reference in its entirety for all purposes.

BACKGROUND

The present invention relates generally to solid-state electronics, and more specifically to an electrically programmable, non-volatile resistive memory.

Electronic memories are integral to computer systems and many electronic circuits. Continuous improvements in the operating speed and computing power of central processing units (CPUs) have enabled the operation of an increasing variety of applications, many of which require larger and faster memories. Larger memories are characterized by having more memory cells to store more bits of data.

Memories may be fabricated using various technologies. A new memory technology that has gain considerable interest uses materials having a perovskite structure to form thin film resistive elements. These resistive elements have multiple stable resistance states and may be used as non-volatile memory elements for memory cells. Each resistive element may be (1) programmed to a high resistance state by applying a narrow electric pulse and (2) programmed (or "erased") to a low resistance state by applying either a narrow electric pulse of an opposite polarity or a wide electric pulse of the same polarity but lower amplitude. The resistance state of each resistive element may thereafter be sensed to determine the logic value of the corresponding memory cell.

A memory array may be efficiently fabricated with resistive elements formed with a perovskite material. Such a memory array also has other desirable characteristics such as (1) ease of decoding to select memory cells for reading, programming, and erasing, (2) ease of programming and erase of the resistive elements, and so on. However, the structure of the memory array is such that a leakage path exists for each resistive element, as described below. The leakage paths of unselected resistive elements can adversely affect the reading and possibly the programming and erase of selected resistive elements.

There is therefore a need in the art for a non-volatile resistive memory having good memory cell isolation for proper reading, programming, and erase of the resistive elements.

SUMMARY

An electrically programmable, non-volatile resistive memory with good memory cell isolation is described herein. Memory cell isolation is achieved using thin film amorphous silicon (a-Si) Schottky diodes, which can provide various desirable characteristics as described below. The memory cell isolation technique described herein may be used with any type of resistive memory materials having resistance states that may be switched with electric pulses of a single polarity—either positive or negative. The memory cell isolation technique described herein enables reliable read, program, and erase of resistive elements formed with perovskite materials.

An embodiment provides an integrated circuit comprising an array of memory cells, a plurality of bit lines, and a plurality of word lines. Each memory cell comprises a resistive element and a Schottky diode coupled in series and having first and second terminals. Each bit line couples to the first terminal of all memory cells in a respective column of the array. Each word line couples to the second terminal of all memory cells in a respective row of the array. The resistive element for each memory cell may be formed with a film of a perovskite material (e.g., $Pr_{0.7}Ca_{0.3}MnO_3$). The Schottky diode for each memory cell may be formed by a thin film of amorphous silicon. The films for the resistive element and Schottky diode for each memory cell may be stacked in a compact island at the cross point between a bit line and a word line.

A multi-layer resistive memory may be formed with multiple layers, where each layer may include an array of memory cells described above.

Various aspects, embodiments, and features of the invention are described in further detail below.

BRIEF DESCRIPTION OF THE DRAWINGS

FIG. 7 shows a perspective view of a single-layer memory structure for the innovative resistive cross-point memory;

FIG. 8 shows a perspective view of one memory cell in the innovative resistive cross-point memory.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
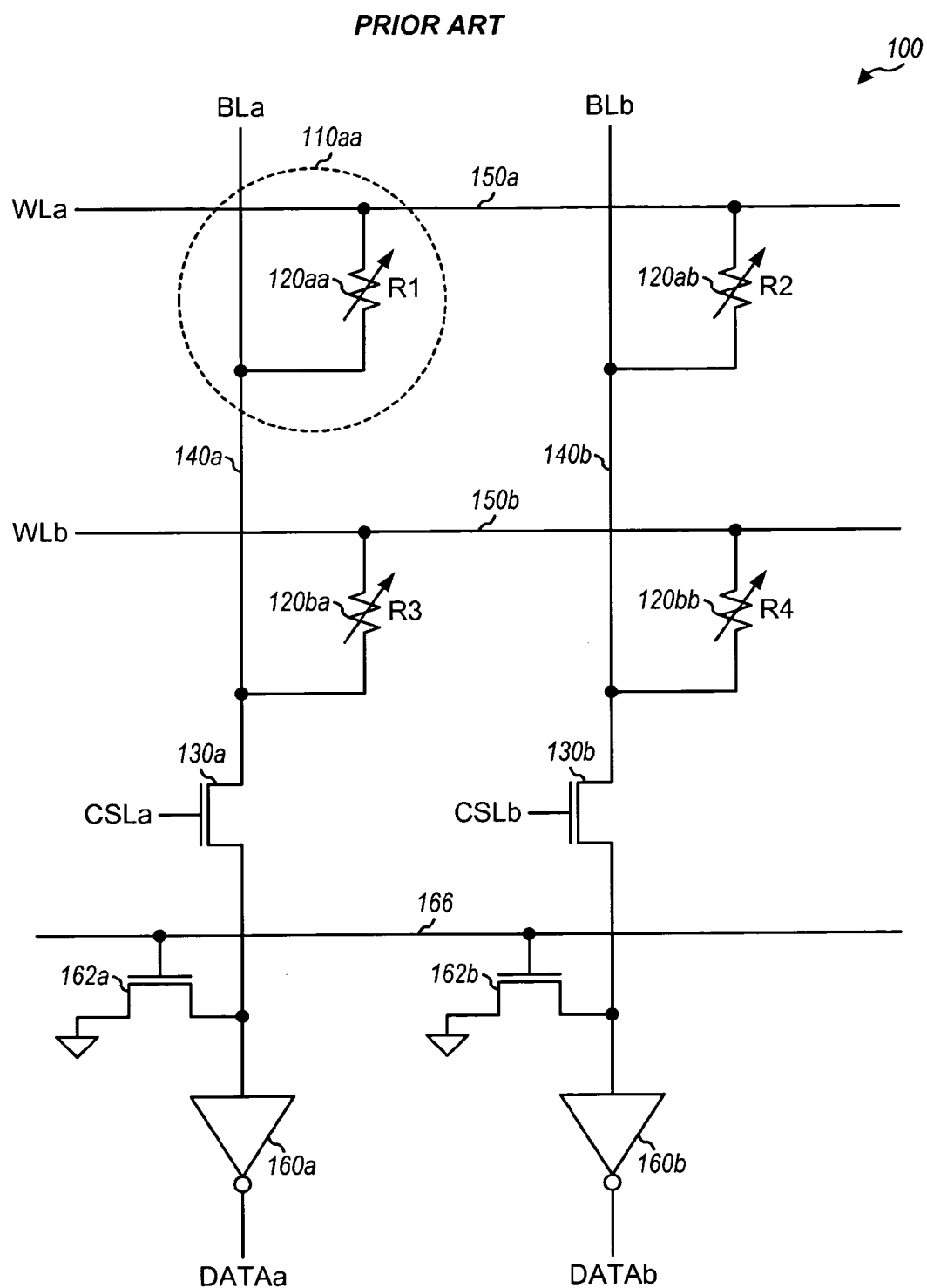
FIG. 1 shows a conventional resistive cross-point memory.

FIG. 1 shows a schematic diagram of a conventional resistive cross-point memory 100. Memory 100 includes a two-dimensional (2-D) array of resistive elements 120, which are formed with a perovskite complex oxide material. Some exemplary types of perovskite materials include $Pr_{0.7}Ca_{0.3}MnO_3$ (PCMO), colossal magnetoresistive (CMR) material, high temperature superconducting (HTSC) material, $Gd_{0.7}Ca_{0.3}BaCo_2O_{5+5}$, and so on. Other types of materials may also be used to form the resistive elements. For clarity, the resistive elements are described below as being formed with PCMO, although other perovskite materials may also be used to form these resistive elements. For simplicity, FIG. 1 shows a 2×2 array of resistive elements for memory 100. In general, a memory may include any number of rows and any number of columns of resistive elements.

A plurality of bit lines 140 are provided for the plurality of columns of the memory array, and a plurality of word lines 150 are provided for the plurality of rows. Each resistive element 120 has one end coupled to a specific bit line (BL) 140 and the other end coupled to a specific word line (WL) 150. One resistive element 120 is thus formed at each crosspoint between a bit line and a word line. One memory cell 110 is formed by each resistive element 120. The resistive elements in each column couple to the same bit line 140, and the resistive elements in each row couple to the same word line 150.

A MOSFET select transistor 130 couples in series at one end of each bit line 140 and is shared by all memory cells coupled to the bit line. Each select transistor 130 has a gate that receives a respective column select line (CSL), which enables or disables the select transistor. Each select transistor 130 further couples to an input of a respective inverter 160, which provides sensed data at its output. The input of each inverter 160 further couples to a respective load transistor 162. The gates of load transistors 162 for all bit lines 140 couple to a line 166. Line 166 provides a proper bias voltage for load transistors 162 and may also be controlled to bring the inputs of inverters 160 to logic low to disable the inverters.

Resistive elements 120 in memory 100 may be individually addressed for a read or program operation. An erase operation may be performed on all resistive elements in a given word line or all resistive elements in a given section with multiple word lines.

The logic value of a selected memory cell may be read by sensing the resistance state of the associated resistive element. To sense the resistance state of resistive element 120aa for memory cell 110aa, select transistor 130a is enabled by providing a logic high (e.g., VDD) on column select line CSLa for bit line 140a, and select transistor 130b is disabled by providing a logic low (e.g., VSS) on column select line CSLb for bit line 140b. Word line 150a is then charged to a high read voltage, $V_{read}$, while word line 150b is maintained at a low voltage. A read current ($I_R$) then flows from word line 150a through resistive element 120aa to bit line 140a. The $I_R$ current is dependent on (1) the voltage drop between word line 150a and bit line 140a and (2) the resistance state of resistive element 120aa. Line 166 is set to the proper voltage to bias load transistors 162. Inverter 160a provides a logic high if the $I_R$ current is less than a threshold current and a logic low otherwise. Inverter 160a thus provides an output that is dependent on the resistance state of resistive element 120aa.

The read operation, as described above, is accurate for a single cell operation and for an ideal resistive memory with no leakage. However, a parasitic sneak leakage path exists via each resistive element. Thus, inverter 160a receives at its input sensing node the desired $I_R$ read current via selected resistive element 120aa as well as the $I_S$ sneak leakage current via unselected resistive element 120ba. The leakage current may be significant enough to adversely affect the reading of the resistance state of the selected resistive element. Significant leakage paths may exist in an M×N memory array, depending on the bias conditions of (1) the word lines for the M−1 unselected rows of memory cells and (2) the bit lines for the N−1 unselected columns of memory cells. Accurate sensing of the resistance state of resistive element 120aa may be problematic due to the existence of the $I_S$ leakage current. For example, the resistances R2, R3, and R4 for resistive elements 120ab, 120ba, and 120bb, respectively, may be much smaller than the resistance R1 for resistive element 120aa. In this case, the leakage currents can be significant enough to adversely impact the correct sensing of the selected resistive element 120aa. The same leakage paths may potentially cause problems in the programming and erase of the resistive elements.

It is thus important to isolate memory cells during read as well as programming operations to obtain accurate read and programming results. For a read operation, the logic state of a memory cell is determined by its absolute or relative resistance value. For a large memory array, sense margin is influenced by (1) the ratio of the resistance values for the high and low resistance states and (2) parasitic leakage currents that feed into the sensing circuitry. The leakage currents in effect act as noise to the desired current from the selected resistive element. Accurate measurement of the current from the selected memory cell is needed, regardless of whatever current or voltage sensing circuitry is used for sensing, in order to properly read the logic value of the selected memory cell.

Various techniques may be used to provide isolation between memory cells so that reading, programming, and erase of resistive elements in a resistive cross-point memory are minimally affected by leakage current. Memory cell isolation is used to prevent current leakage paths, improve the signal-to-noise ratio, and reduce dynamic power consumption. Memory cell isolation may also prevent problems in program operation due to program disturb and charge pump loading. Memory cell isolation may be achieved by using transistors, diodes, and inhibit voltages on unselected word lines/bit lines.

Figure 2A:
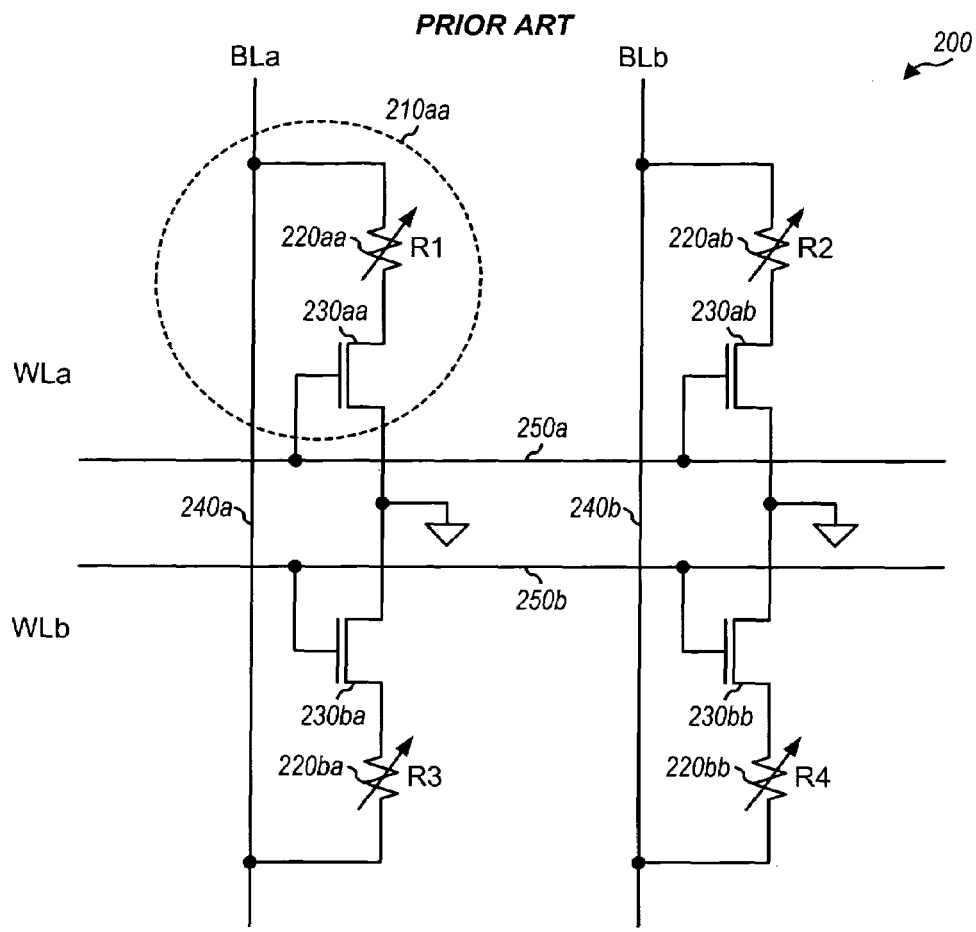
FIG. 2A shows a conventional resistive cross-point memory that uses select transistors for memory cell isolation.

FIG. 2A shows a conventional resistive cross-point memory 200 that uses select transistors for memory cell isolation. Memory 200 includes a 2-D array of resistive elements 220 that are arranged into rows and columns. Each resistive element 220 has one end coupled to a specific bit line 240 and the other end coupled to the drain of an associated select transistor 230. The gates of all select transistors 230 for each row couple to a respective word line 250, and the sources of all select transistors couple to circuit ground. Each memory cell 210 is formed with one resistive element 220 and one select transistor 230. Memory 200 is commonly referred to as a "1R1T" structure.

To read the resistance state of a selected resistive element 220aa, a logic high is provided for word line 250a, which then turns on select transistor 230aa and shorts resistive element 220aa to circuit ground. A logic low is provided for the word lines for all other rows. An $I_R$ read current flows from bit line 240a through both resistive element 220aa and select transistor 230aa to circuit ground. The $I_R$ current is sensed to determine the resistance state of resistive element 220aa and thus the logic value of selected memory cell 210aa. Select transistors 230 for unselected memory cells are disabled and only a small leakage current flows through the unselected resistive elements.

Figure 2B:
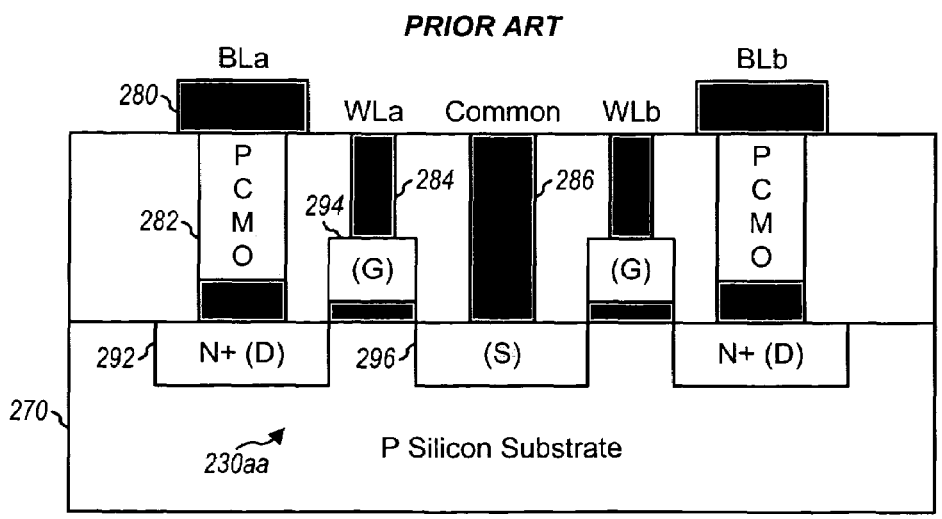
FIG. 2B shows a cross-sectional view of the memory in FIG. 2A.

FIG. 2B shows a cross-sectional view of a portion of memory 200. Bit lines 240 are formed by conductors 280. Each resistive element 220 is formed with a PCMO film 282 underneath a bit line conductor 280. Each select transistor 230 is formed with an N+ well 292 for the drain (D), a well 294 for the gate (G), and a well 296 for the source (S). Well 292 is located beneath PCMO layer 282, well 294 is located beneath a conductor 284 for the word line, and well 296 is located beneath a common conductor 286 for circuit ground.

Figure 3A:
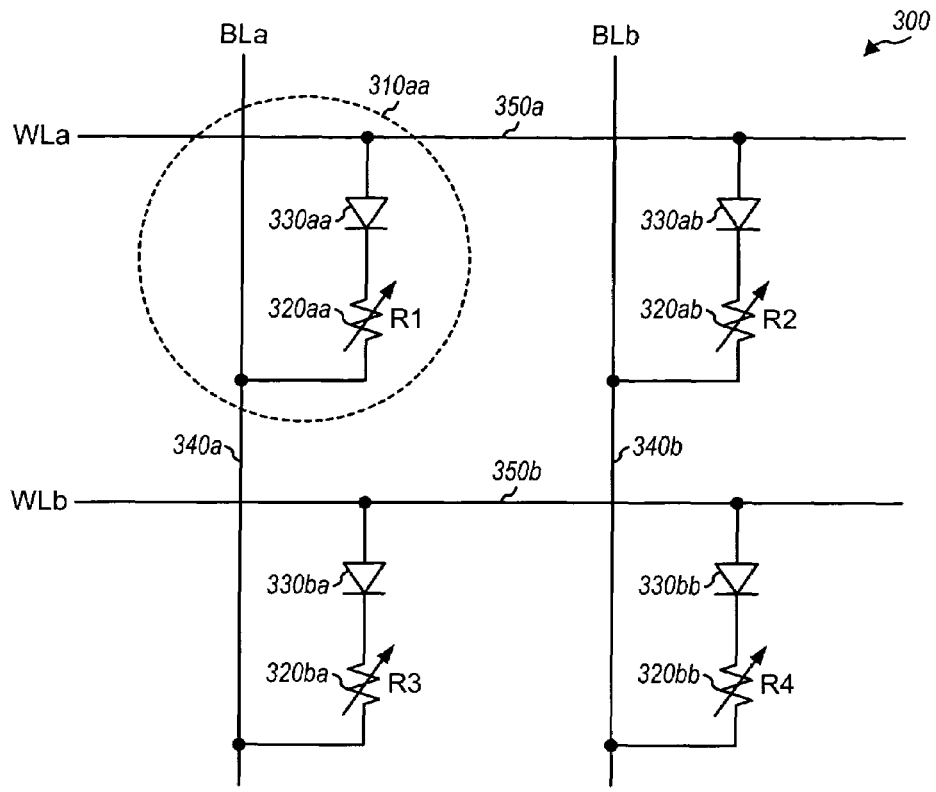
FIG. 3A shows a conventional resistive cross-point memory that uses bulk junction diodes for memory cell isolation.

FIG. 3A shows a conventional resistive cross-point memory 300 that uses bulk junction diodes for memory cell isolation. Memory 300 includes a 2-D array of resistive elements 320 that are arranged into rows and columns. Each resistive element 320 has one end coupled to a specific bit line 340 and the other end coupled to the cathode of an associated bulk diode 330. The anodes of all bulk diodes 330 for each row couple to a respective word line 350. Each memory cell 310 is formed with one resistive element 320 and one bulk diode 330. Memory 300 is thus commonly referred to as a "1R1D" structure.

To read the resistance state of selected resistive element 320aa, word line 350a is charged to a high voltage, and the word lines for all other rows are maintained at a low voltage. An $I_R$ read current flows from word line 350a through both diode 330aa and resistive element 320aa to bit line 340a. The $I_R$ current is sensed to determine the resistance state of resistive element 320aa and thus the logic value of selected memory cell 310aa. Diodes 330 for unselected memory cells are reverse biased and only a small leakage current flows through the unselected resistive elements.

Figure 3B:
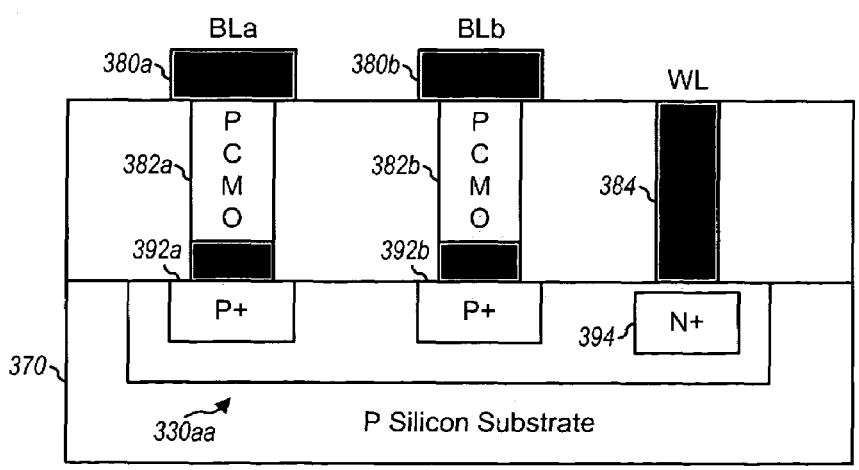
FIG. 3B shows a cross-sectional view of the memory in FIG. 3A.

FIG. 3B shows a cross-sectional view of a portion of memory 300. Bit lines 340 are formed by conductors 380. Each resistive element 320 is formed with a PCMO layer 382 underneath a bit line conductor 380. Each bulk diode 330 is formed by a P+ well 392 for the cathode and a well 394 for the anode. Well 392 is located beneath PCMO layer 382, and well 394 is located beneath a conductor 384 for a word line.

Select transistors 230 in FIG. 2A and bulk junction diodes 330 in FIG. 3A are bulk devices that are fabricated on a substrate. Bulk devices typically occupy a large silicon area.

The use of select transistors and bulk junction diodes for memory cell isolation as shown in FIGS. 2A and 3A, respectively, has significant drawbacks for high-density memory applications. First, the use of a MOSFET select transistor for each memory cell (in FIG. 2A) represents a large overhead in silicon area. The bulk junction diodes (in FIG. 3A) improve little in this respect due to diffusion spacing. Second, memory arrays that have bulk junction diodes or select transistors on the bit lines or word lines often suffer significant speed penalties due to junction capacitance from these devices. Third, it is not possible to stack bulk devices. The memory cell isolation techniques in FIGS. 2A and 3A thus cannot be used for constructing multi-layer resistive memories.

Figure 4A:
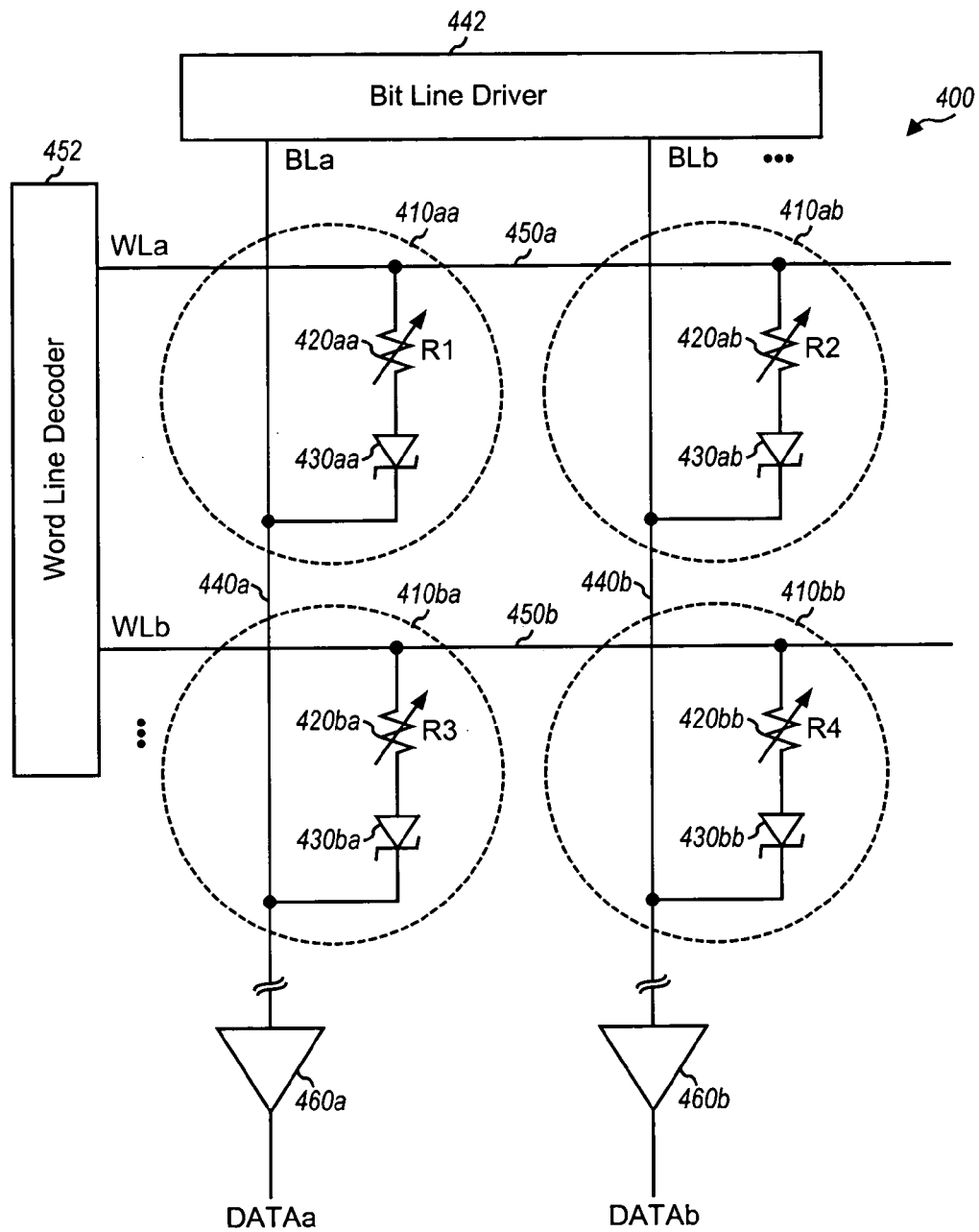
FIGS. 4A and 4B show two embodiments of an innovative resistive cross-point memory that uses thin film Schottky diodes for memory cell isolation.

FIG. 4A shows an embodiment of an innovative resistive cross-point memory 400 that uses thin film Schottky diodes for memory cell isolation. Memory 400 includes an array of resistive elements 420 arranged into rows and columns. For the embodiment shown in FIG. 4A, each resistive element 420 has one end coupled to a specific word line 450 and the other end coupled to the anode of an associated Schottky diode 430. The cathodes of all Schottky diodes 430 for each column couple to a respective bit line 440. Each memory cell 410 is formed with one resistive element 420 and one Schottky diode 430. A sense amplifier 460 couples to each bit line 440 and senses the current on the bit line. Sense amplifiers 460 may implement any current sensing techniques known in the art.

Figure 4B:
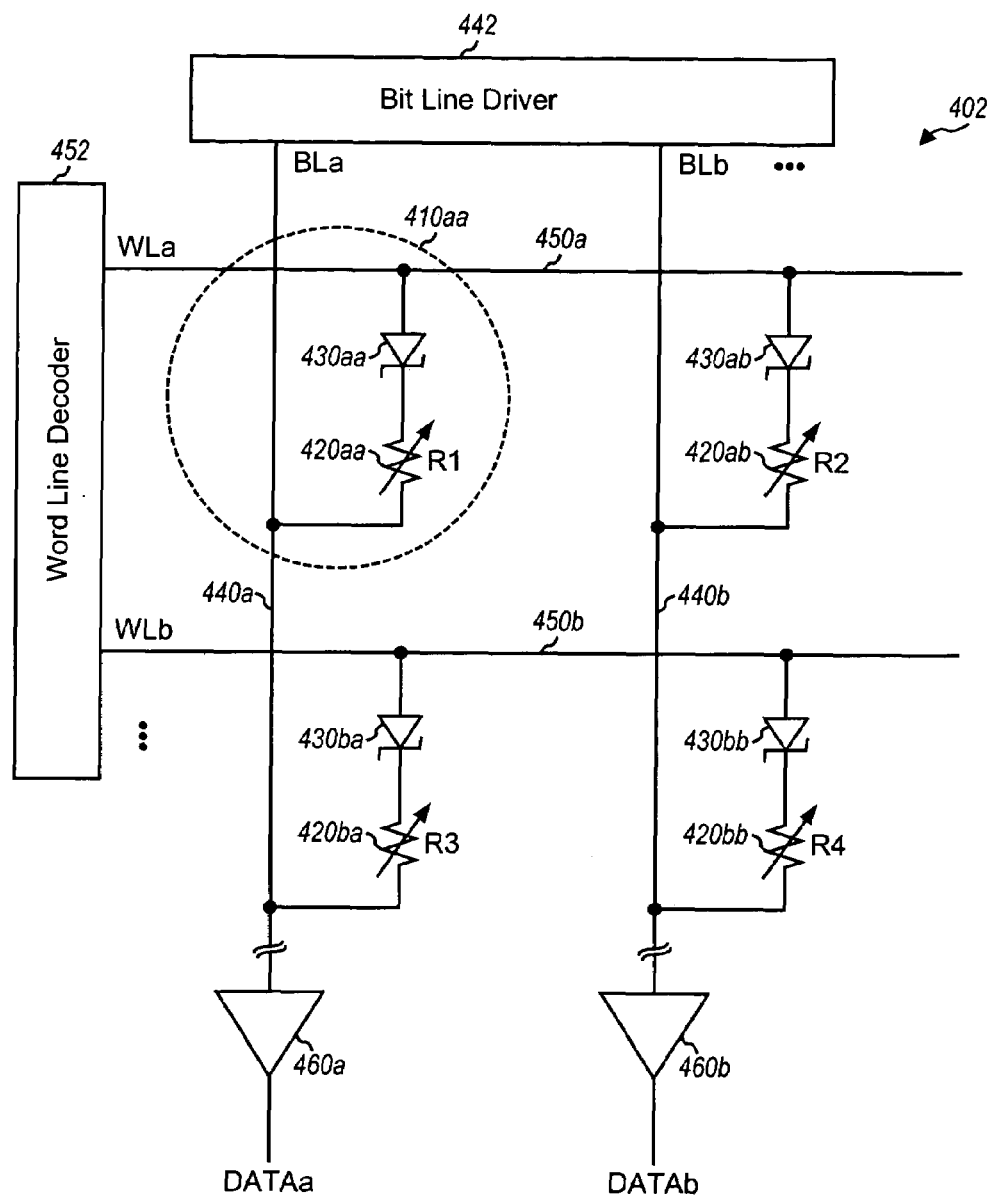

FIG. 4B shows another embodiment of an innovative resistive cross-point memory 402 that also uses a-Si Schottky diodes for memory cell isolation. Memory 402 includes an array of resistive elements 420 arranged into rows and columns. For the embodiment shown in FIG. 4B, each resistive element 420 has one end coupled to a specific bit line 440 and the other end coupled to the cathode of an associated Schottky diode 430. The anodes of all Schottky diodes 430 for each row couple to a respective word line 450. Each memory cell 410 is formed with one resistive element 420 and one Schottky diode 430.

Memories 400 and 402 use thin film Schottky diodes 430 for memory cell isolation instead of bulk junction diodes 330. Schottky diodes 430 are functionally equivalent to bulk junction diodes 330 and can minimize leakage current from adversely affecting reading, programming, and erase of the resistive elements. However, Schottky diodes 430 provide several key advantages over bulk junction diodes 330. First, a-Si Schottky diodes can be more easily and efficiently fabricated than bulk junction diodes, which improves area efficiency and allows for a more densely packed memory. In particular, a-Si Schottky diodes may be fabricated with thin films and at low temperatures. Furthermore, multiple layers of thin film devices may be fabricated on top of standard CMOS wafers. Second, a three-dimensional (3-D) multi-layer cross-point memory with multiple layers of memory cells may be fabricated using Schottky diodes, as described below. In contrast, a resistive memory with only one layer of memory cells may be fabricated using bulk junction diodes.

In general, diodes may be used for memory cell isolation if programming and erase of the resistive elements can be performed with electric pulses of the same polarity (but possibly of different pulse widths and/or amplitudes). A resistive element formed with a perovskite material such as PCMO may be programmed to the high resistance state or erased to the low resistance state using same polarity electric pulses. In this case, it is possible to use a P-N diode for each memory cell for isolation. Each memory cell may be read, programmed, or erased from the anode terminal of the diode.

Figures 5A, 5B:
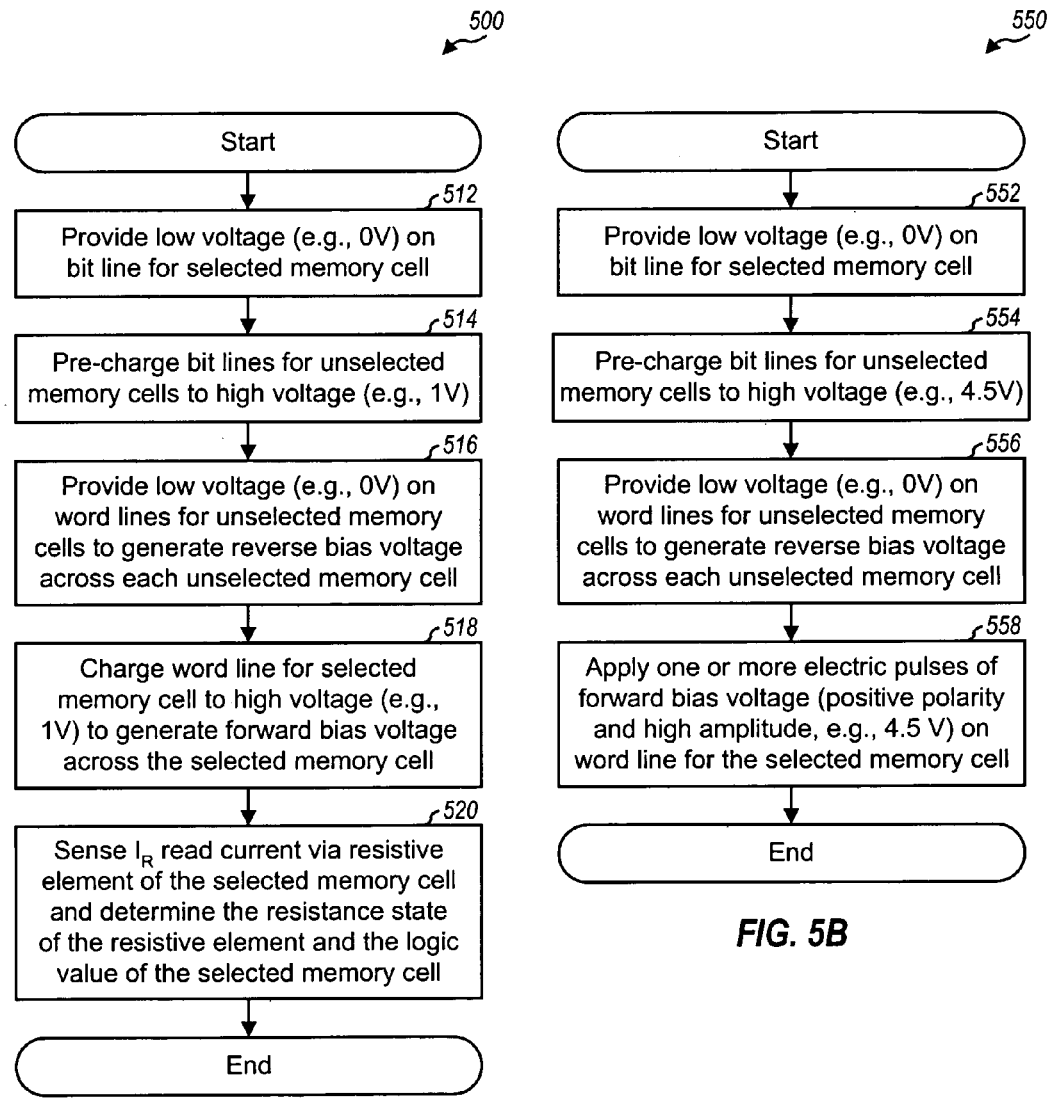
FIGS. 5A and 5B show processes to perform a read operation and a programming operation, respectively, for a resistive element of a selected memory cell.

FIG. 5A shows a flow diagram of a process 500 to perform a read operation to sense the resistance state of a resistive element for a selected memory cell. Initially, a bit line driver 442 provides a low voltage (e.g., 0 Volt) on the bit line for the selected memory cell (step 512) and pre-charges the bit lines for the unselected memory cells to a high voltage (e.g., approximately 0.5 to 1.0 Volt) (step 514). A word line decoder 452 provides a low voltage (e.g., 0 Volt) on the word lines for the unselected memory cells to generate a reverse bias voltage across each unselected memory cell (step 516). A reverse bias voltage is any (positive or negative) voltage that is less than the voltage needed to turn on a Schottky diode. Word line driver 452 also charges the word line for the selected memory cell to a high voltage (e.g., 1 Volt) to generate a forward bias voltage across the selected memory cell (step 518). The Schottky diode for the selected memory cell is thus forward biased, and the Schottky diodes for the unselected memory cells are reverse biased. An $I_R$ current flows from the selected word line through both the resistive element and Schottky diode for the selected memory cell to the selected bit line. A sense amplifier senses the $I_R$ read current to determine the resistance state of the resistive element and thus the logic value of the selected memory cell (step 520). The Schottky diodes for the unselected memory cells act as switches that are opened by the reverse bias voltages. Thus, only a small leakage current flows through the unselected resistive elements. This prevents sneak leakage current from flowing into the sense amplifier, which enhances read margin and speed.

FIG. 5B shows a flow diagram of a process 550 to perform a programming operation on the resistive element for a selected memory cell. Initially, bit line driver 442 provides a low voltage (e.g., 0 Volt) on the bit line for the selected memory cell (step 552) and pre-charges the bit lines for the unselected memory cells to a high voltage (e.g., 4.5 Volt) (step 554). Word line driver 452 provides a low voltage (e.g., 0 Volt) on the word lines for the unselected memory cells to generate a reverse bias voltage across each unselected memory cell (step 556). Word line driver 452 also applies one or more electric pulses of a forward bias voltage (i.e., of a positive polarity and high amplitude, e.g., of 4.5 Volts) on the word line for the selected memory cell (step 558).

An erase operation may be performed on one or more resistive elements in similar manner as for the programming operation. The electric pulses used for erase have the same polarity but a different amplitude (e.g., 3.3 Volts) and/or a longer width (e.g., in the millisecond range) than the electric pulse used for programming. In general, the pulse width and amplitude of the electric pulse used for programming and erase are determined by the specific construction of the resistive elements and may be dependent on the IC process technology.

Table 1 shows exemplary voltages on the bit lines ($V_{BL}$) and voltages on the word lines ($V_{WL}$) for read, program, and erase operations for the four memory cells 410aa, 410ab, 410ba, and 410bb shown in FIGS. 4A and 4B. Memory cell 410aa is the selected memory cell being read, programmed, or erased, and the other three memory cells are the unselected memory cells. Other voltages may also be used for read, program, and erase.

TABLE 1

| Memory Cell | Read | | Program | | Erase | |
|---|---|---|---|---|---|---|
| | $V_{WL}$ | $V_{BL}$ | $V_{WL}$ | $V_{BL}$ | $V_{WL}$ | $V_{BL}$ |
| Memory cell 410aa | 1 V | 0 V | 4.5 V | 0 V | 3.3 V | 0 V |
| Memory cell 410ab | 1 V | 0.5–1 V | 4.5 V | 4.5 V | 3.3 V | 3.3 V |
| Memory cell 410ba | 0 V | 0 V | 0 V | 0 V | 0 V | 0 V |
| Memory cell 410bb | 0 V | 0.5–1 V | 0 V | 4.5 V | 0 V | 3.3 V |

Figure 6:
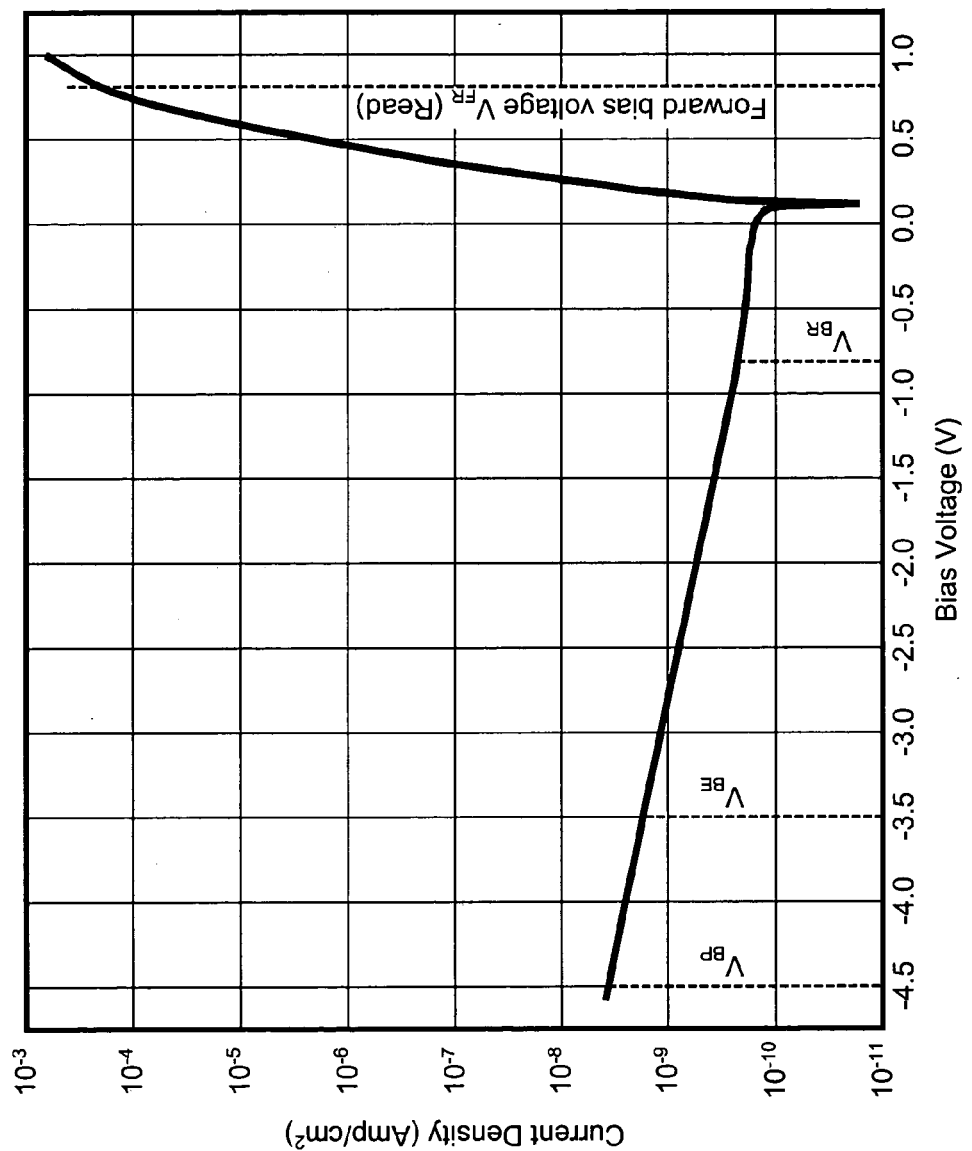
FIG. 6 shows a transfer function of current density versus bias voltage for a thin film Schottky diode.

FIG. 6 shows a transfer function of current density versus bias voltage for a thin film a-Si Schottky diode. With a forward bias voltage ($V_{FR}$) of 0.7 Volts or greater applied to the Schottky diode for a read operation, the $I_R$ read current for the memory cell is dominated by the resistive element. With a reverse bias voltage ($V_{BR}$) of 0.7 Volts or greater applied when not selected for a read operation, the $I_S$ leakage current for the memory cell is negligible because of the reverse biased Schottky diode. The $I_S$ leakage currents for the memory cell with a reverse bias voltage ($V_{BE}$) of 3.5 Volts for an erase operation and with a reverse bias voltage ($V_{BP}$) of 4.5 Volts for a programming operation are also negligible because of the reverse biased Schottky diode. Thus, program disturb on unselected memory cells is also improved since there is minimal leakage current flowing into the unselected memory cells on the same word line being programmed or erased.

The innovative resistive cross-point memory described herein also has other advantages. First, considerable simplification may be achieved for the bit line drivers. Second, a bit-by-bit erase of the resistive elements is possible, similar to EEPROM.

FIG. 7 shows a perspective view of a memory structure 700 that may be used for resistive cross-point memory 402 in FIG. 4B. Bit lines 440 are formed by conductors 740 running along one direction, and word lines 450 are formed by conductors 750 running along a transverse direction. A memory cell 710 is formed at each cross point of bit line conductor 740 and word line conductor 750. Each memory cell 710 is formed by a stack of thin films that is etched in an island.

FIG. 8 shows a perspective view of one memory cell 710aa in memory structure 700. Memory cell 710aa is formed with a stack of thin films that includes, from the bottom up, (1) a film 812 of amorphous silicon (a-Si) doped with arsenide (As) deposited on top of conductor 750a for a word line, (2) a film 814 of intrinsic a-Si deposited on top of film 812, (3) a layer 816 of a transition metal element Platinum (Pt) deposited on top of film 814, and (4) a film 818 of PCMO deposited on top of layer 816 and beneath conductor 740a for a bit line.

FIG. 8 also shows an equivalent electrical circuit for memory cell 710aa. Resistive element 420aa is formed by film 818 of PCMO. Schottky diode 430aa is formed by film 814 of intrinsic a-Si and film 812 of a-Si doped with As. Film 812 provides an ohmic contact between intrinsic a-Si film 814 and conductor 750a.

Figure 9:
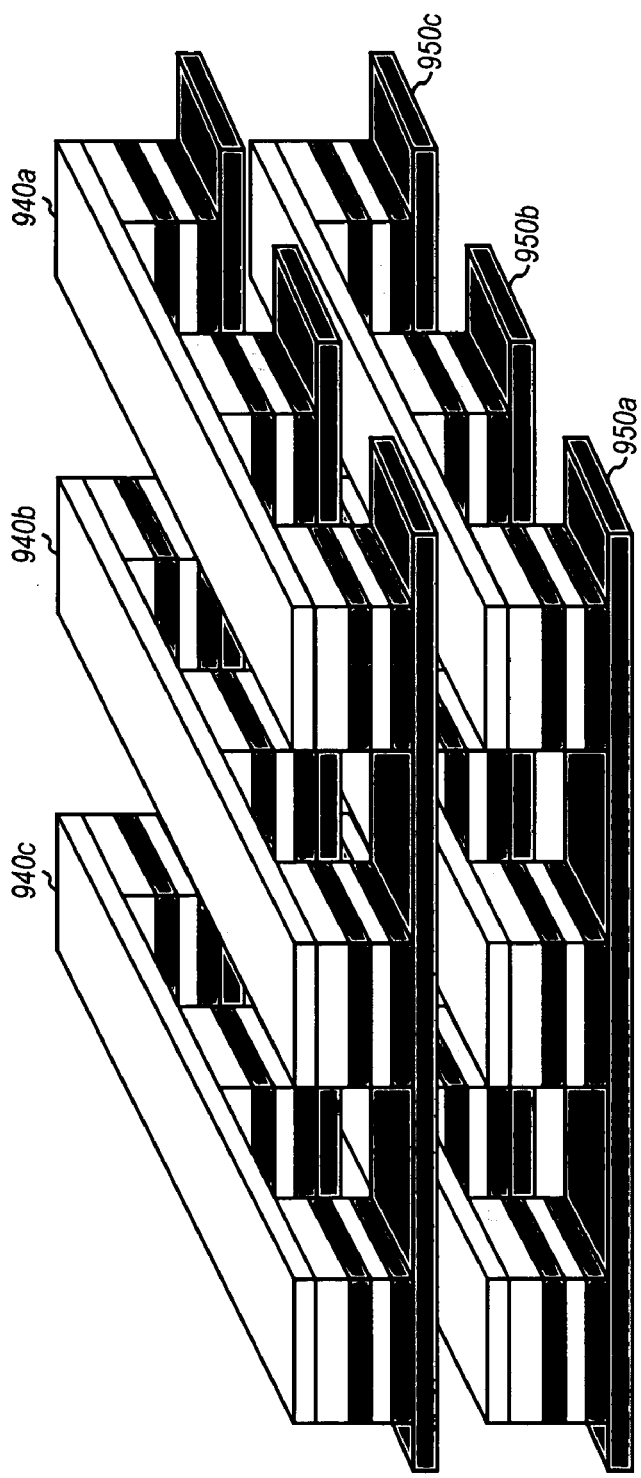
FIG. 9 shows a perspective view of a multi-layer memory structure for the innovative resistive cross-point memory.

FIG. 9 shows a perspective view of a memory structure 900 for a multi-layer cross-point memory with multiple layers of memory cells. Because each memory cell may be fabricated with a stack of thin films, as shown in FIG. 8, multiple layers 902a, 902b, and so on of memory cells may be fabricated on top of one another. A layer 904 of oxide may be used to provide isolation between layers 902a and 902b of memory cells. In general, any number of layers of memory cells may be stacked in a third dimension (vertically). Memory density is thus limited only by the number of cell fabrics at a given technology node, which means that memory capacity can be arithmetically increased by stacking more memory layers, as described above, without shrinking technology design rules. Each layer 902 includes conductors 940 for the bit lines for that layer and conductors 950 for the word lines for that layer.

The innovative resistive cross-point memory described herein may be used for various types of non-volatile memories. For example, the innovative resistive memories may be used for a Flash, a static random access memory (SRAM), a synchronous graphics RAM (SGRAM), and so on. The innovative resistive memory may be used for a memory unit embedded within an integrated circuit such as, for example, a processor, a controller, a digital signal processor (DSP), an application specific integrated circuit (ASIC), a central processing unit (CPU), and so on. The innovative resistive memory may also be implemented within a stand-alone memory integrated circuit.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
a first array of memory cells, each memory cell in the first array comprising a resistive element and a Schottky diode coupled in series and having first and second terminals, the resistive element being formed by a single layer of material, the Schottky diode being formed by two layers, the single layer for the resistive element and the two layers for the Schottky diode being stacked together;
a first plurality of bit lines, one bit line for each column of the first array, each bit line coupled to the first terminal of memory cells in a respective column of the first array; and a first plurality of word lines, one word line for each row of the first array, each word line coupled to the second terminal of memory cells in a respective row of the first array wherein the resistive element for each memory cell is formed by a perovskite material.

2. The integrated circuit of claim 1, wherein the perovskite material is Pr0.7Ca0.3MnO3.

3. The integrated circuit of claim 1, wherein the perovskite material is a colossal magnetoresistive (CMR) material.

4. The integrated circuit of claim 1, wherein the two layers for the Schottky diode for each memory cell comprise a layer of amorphous silicon.

5. The integrated circuit of claim 1, wherein a memory cell is formed at each cross point between a bit line and a word line.

6. The integrated circuit of claim 1, wherein the resistive element for each memory cell is programmable to have one of two resistance states.

7. The integrated circuit of claim 1, further comprising:
a bit line driver operative to drive the first plurality of bit lines for reading and programming the memory cells.

8. The integrated circuit of claim 1, further comprising:
a word line decoder operative to drive the first plurality of word lines for reading and programming the memory cells.

9. The integrated circuit of claim 1, further comprising:
a plurality of sense amplifiers coupled to the first plurality of bit lines, each sense amplifier operative to sense a current on a respective bit line to determine a resistance state of a resistive element for a memory cell selected for reading.

10. The integrated circuit of claim 1, further comprising:
a second array of memory cells, each memory cell in the second array comprising a resistive element and a Schottky diode coupled in series and having first and second terminals;
a second plurality of bit lines, one bit line for each column of the second array, each bit line coupled to the first terminal of memory cells in a respective column of the second array; and
a second plurality of word lines, one word line for each row of the second array, each word line coupled to the second terminal of memory cells in a respective row of the second array.

11. A memory device comprising:
an array of memory cells, each memory cell comprising a resistive element and a Schottky diode coupled in series and having first and second terminals, the resistive element being formed by a single layer of material, the Schottky diode being formed by two layers, the single layer for the resistive element and the two layers for the Schottky diode being stacked together;
a plurality of bit lines, one bit line for each column of the array, each bit line coupled to the first terminal of memory cells in a respective column of the array;
a plurality of word lines, one word line for each row of the array, each word line coupled to the second terminal of memory cells in a respective row of the array;
a bit line driver operative to drive the plurality of bit lines for reading and programming the memory cells;
a word line decoder operative to drive the plurality of word lines for reading and programming the memory cells; and
a plurality of sense amplifiers coupled to the plurality of bit lines, each sense amplifier operative to sense a current on a respective bit line to determine a resistance state of a resistive element for a memory cell selected for reading.

12. The memory device of claim 11, wherein the resistive element for each memory cell is formed by a perovskite material.

13. The memory device of claim 11, wherein the two layers for the Schottky diode for each memory cell comprise a layer of amorphous silicon.

14. The integrated circuit of claim 10, further comprising:
an isolation layer between a first layer and a second layer, wherein the first layer is formed by the first array of memory cells, the first plurality of bit lines, and the first plurality of word lines, and wherein the second layer is formed by the second array of memory cells, the second plurality of bit lines, and the second plurality of word lines.

* * * * *